(12) United States Patent
Moss et al.

(10) Patent No.: US 10,645,836 B2
(45) Date of Patent: May 5, 2020

(54) SYSTEM FOR A RACK DESIGN

(71) Applicant: DELL PRODUCTS L.P., Round Rock, TX (US)

(72) Inventors: David L. Moss, Austin, TX (US); Shawn P. Hoss, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 703 days.

(21) Appl. No.: 14/831,607

(22) Filed: Aug. 20, 2015

(65) Prior Publication Data

US 2015/0359129 A1 Dec. 10, 2015

Related U.S. Application Data

(63) Continuation of application No. 11/777,586, filed on Jul. 13, 2007, now Pat. No. 9,148,980.

(51) Int. Cl.
*H05K 7/14* (2006.01)
*A47B 45/00* (2006.01)
(Continued)

(52) U.S. Cl.
CPC ........... *H05K 7/1488* (2013.01); *A47B 45/00* (2013.01); *G06F 1/20* (2013.01); *H05K 7/20709* (2013.01);
(Continued)

(58) Field of Classification Search
CPC ....................................................... F24F 13/32
(Continued)

(56) References Cited

U.S. PATENT DOCUMENTS

| 1,433,455 | A | * | 10/1922 | Horton | ................. | H02J 7/0042 |
| | | | | | | 320/107 |
| 2,530,233 | A | * | 11/1950 | Dockray | ................. | H05K 7/18 |
| | | | | | | 312/198 |

(Continued)

FOREIGN PATENT DOCUMENTS

JP    2011089686    5/2011

OTHER PUBLICATIONS

Baldassion, Nadia and Claudio Bernuzzi: Analysis and behavior of steel storage pallet racks. 2000 Elsevier Science Ltd (published Jan. 5, 2000), of particular interest: pp. 1 - 7, 22, 23. (Year: 2000).*

(Continued)

*Primary Examiner* — Steven B McAllister
*Assistant Examiner* — Frances F. Hamilton
(74) *Attorney, Agent, or Firm* — Baker Botts L.L.P.

(57) ABSTRACT

A rack system is disclosed. The racks and the computer systems included within the racks have a shallow configuration. The racks are placed next to one another in a back-to-back configuration in which the backs of each of the racks are adjacent to one another. All of the user-accessible components of the computers system face toward the front of each rack. The heated air from each of the computer systems is expelled in the space between each of the racks. The space between each of the racks is relatively narrow, as there are no user-accessible components between the racks. The racks are coupled to one another with a bar that may include at least some spring action to accommodate some movement of the racks toward or away from one another without the tipping of either rack.

20 Claims, 1 Drawing Sheet

(51) Int. Cl.
*H05K 7/20* (2006.01)
*G06F 1/20* (2006.01)
*H05K 7/18* (2006.01)

(52) U.S. Cl.
CPC .......... *H05K 7/20745* (2013.01); *H05K 7/18* (2013.01); *Y10T 29/49828* (2015.01)

(58) Field of Classification Search
USPC .......... 454/184; 248/639, 581, 227.2, 227.4, 248/570
See application file for complete search history.

(56) References Cited

U.S. PATENT DOCUMENTS

| | | | | |
|---|---|---|---|---|
| 3,732,930 | A * | 5/1973 | D'Anneo | A62C 37/10 169/54 |
| 3,802,574 | A * | 4/1974 | Weider | A47B 47/027 108/187 |
| 4,360,991 | A * | 11/1982 | West | E04B 2/7416 312/286 |
| 4,934,893 | A | 6/1990 | Johnson | 414/458 |
| 5,289,348 | A | 2/1994 | Miller | 361/809 |
| 5,360,210 | A * | 11/1994 | Loziuk | F16F 7/14 248/570 |
| 5,363,613 | A * | 11/1994 | Sevier | A47B 47/025 108/115 |
| 5,482,259 | A * | 1/1996 | Loziuk | F16F 7/14 248/570 |
| 5,797,227 | A * | 8/1998 | Garza-Tamez | E02D 27/34 188/360 |
| 5,835,195 | A | 11/1998 | Gibson et al. | 355/53 |
| 5,934,485 | A * | 8/1999 | Harris | H05K 7/186 211/189 |
| 5,975,315 | A * | 11/1999 | Jordan | H05K 7/183 211/189 |
| 6,036,286 | A | 3/2000 | Krumholz | 312/198 |
| 6,259,605 | B1 | 7/2001 | Schmitt | 361/727 |
| 6,349,039 | B1 | 2/2002 | Boe | 361/801 |
| 6,452,805 | B1 * | 9/2002 | Franz | G02B 6/4471 174/154 |
| 6,496,366 | B1 | 12/2002 | Coglitore et al. | |
| 6,604,640 | B1 * | 8/2003 | Jehin | A47B 47/027 211/189 |
| 6,644,484 | B1 | 11/2003 | Sardis | 211/190 |
| 6,667,891 | B2 | 12/2003 | Coglitore et al. | 361/796 |
| 6,672,955 | B2 * | 1/2004 | Charron | F24F 3/0442 361/691 |
| 6,702,412 | B2 | 3/2004 | Dobler et al. | 312/334.5 |
| 6,822,859 | B2 | 11/2004 | Coglitore et al. | |
| 6,836,030 | B2 | 12/2004 | Smith et al. | |
| 6,850,408 | B1 | 2/2005 | Coglitore et al. | |
| 6,859,366 | B2 * | 2/2005 | Fink | E04H 5/02 165/121 |
| 6,867,966 | B2 | 3/2005 | Smith et al. | |
| 6,909,611 | B2 | 6/2005 | Smith et al. | |
| 6,951,288 | B2 * | 10/2005 | Henderson | H02B 1/54 211/26 |
| 6,995,973 | B2 * | 2/2006 | Barsun | G06F 1/181 361/679.57 |
| 7,085,133 | B2 | 8/2006 | Hall | 361/695 |
| 7,173,821 | B2 | 2/2007 | Coglitore | |
| 7,192,103 | B2 | 3/2007 | Hamilton | 312/334.5 |
| 7,236,358 | B2 | 6/2007 | Dobbs et al. | 361/679.31 |
| 7,249,442 | B2 | 7/2007 | Pellegrino et al. | 52/167.8 |
| 7,255,234 | B2 * | 8/2007 | Luffel | H05K 7/1421 211/26 |
| 7,263,806 | B2 | 9/2007 | Pellegrino et al. | 52/167.8 |
| 7,403,391 | B2 * | 7/2008 | Germagian | H05K 7/20745 361/690 |
| 7,413,091 | B2 * | 8/2008 | Krull | A47F 7/04 211/162 |
| 7,419,075 | B2 | 9/2008 | Green | 224/405 |
| 7,430,118 | B1 * | 9/2008 | Noteboom | H05K 7/20745 165/104.33 |
| 7,477,514 | B2 * | 1/2009 | Campbell | H05K 7/20745 165/80.4 |
| 7,682,234 | B1 * | 3/2010 | Beitelmal | F24F 11/0001 361/695 |
| 7,748,546 | B2 | 7/2010 | Konstant | 211/191 |
| 7,768,780 | B2 | 8/2010 | Coglitore et al. | 361/695 |
| 7,800,900 | B1 | 9/2010 | Noteboom et al. | 361/679.47 |
| 7,841,199 | B2 | 11/2010 | VanGilder et al. | 62/259.2 |
| 7,874,433 | B2 * | 1/2011 | Levesque | H05K 7/1425 211/26 |
| 7,885,795 | B2 * | 2/2011 | Rasmussen | G06F 1/20 361/688 |
| 8,015,760 | B2 | 9/2011 | Kemeny | 52/167.4 |
| 8,037,644 | B2 | 10/2011 | Hall | 52/69 |
| 8,250,818 | B2 * | 8/2012 | Tremblay | E04H 9/02 52/1 |
| 8,659,905 | B2 * | 2/2014 | Knoop | H05K 5/02 312/223.2 |
| 10,314,395 | B2 * | 6/2019 | McGhee, III | A47B 87/001 |
| 2002/0084236 | A1 | 7/2002 | Gearin et al. | 211/85.8 |
| 2004/0104647 | A1 * | 6/2004 | Nemec | A47B 53/02 312/201 |
| 2004/0252467 | A1 * | 12/2004 | Dobbs | G06F 1/16 361/752 |
| 2005/0265004 | A1 * | 12/2005 | Coglitore | G06F 1/183 361/724 |
| 2006/0171667 | A1 | 8/2006 | Murski et al. | 386/83 |
| 2006/0225446 | A1 * | 10/2006 | Bash | F24F 3/048 62/178 |
| 2006/0237378 | A1 * | 10/2006 | Pellegrino | A47F 5/0018 211/29 |
| 2006/0260338 | A1 * | 11/2006 | VanGilder | G06F 1/20 62/259.2 |
| 2007/0170137 | A1 * | 7/2007 | Thelwell | B65G 1/02 211/183 |
| 2008/0170373 | A1 * | 7/2008 | Just | H05K 7/1488 361/729 |
| 2009/0168345 | A1 * | 7/2009 | Martini | F24F 11/0001 361/691 |
| 2010/0061057 | A1 * | 3/2010 | Dersch | H05K 7/20745 361/690 |
| 2010/0248609 | A1 * | 9/2010 | Tresh | H05K 7/20745 454/184 |
| 2013/0105428 | A1 * | 5/2013 | Yaniak | A47B 55/00 211/168 |

OTHER PUBLICATIONS

Approved American National Standard: MH16.1: 2008 (a revision of Mh 16.1: 2004). Material Handling Industry 2008, of particular interest: section 2.4 pp. 5, 6; section 6.4 p. 24; section 8.1 pp. 27, 28 (Year: 2008).*

Moss, David, Guidelines for Assessing Power and Cooling Requirements in the Data Center, Dell Power Solutions, Aug. 2005, pp. 62-62, located at http://www.dell.com/downloads/global/power/ps3q05-20050115-Moss.pdf, Aug. 2005.

Artman, Paul et al., Dell PowerEdge 1650: Rack Impacts on Cooling for High Density Servers, Dell White Paper, Aug. 2002, located at http://www.dell.com/downloads/global/products/pedge/en/rack_coolingdense.doc, Aug. 2002.

* cited by examiner

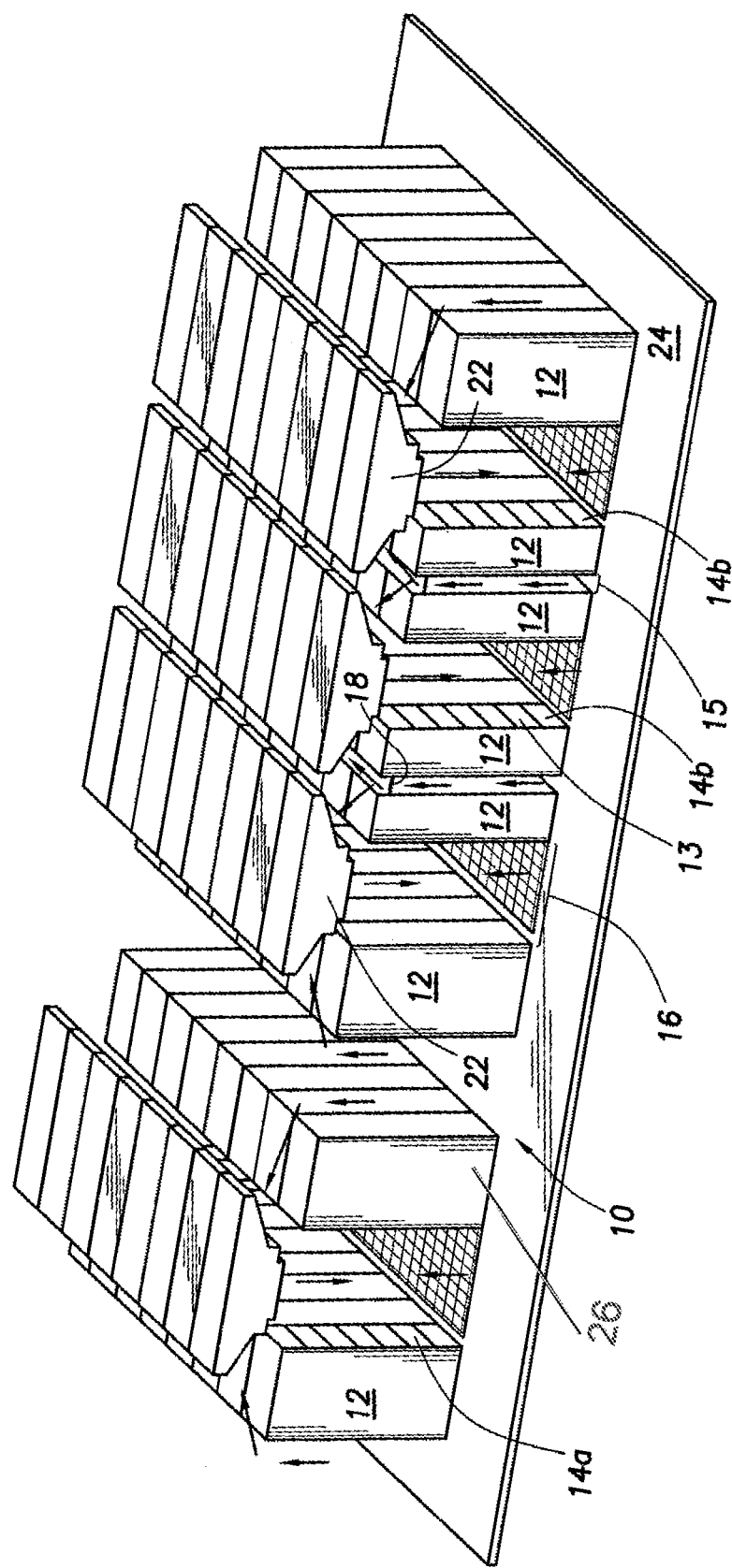

SYSTEM FOR A RACK DESIGN

CROSS-REFERENCE TO RELATED APPLICATION

This application is a continuation of application Ser. No. 11/777,586, filed Jul. 13, 2007, which is incorporated herein by reference.

TECHNICAL FIELD

The present disclosure relates generally to computer systems and information handling systems, and, more particularly, to a system and method for a rack design for an information handling system and the deployment of the rack design in a data center.

BACKGROUND

As the value and use of information continues to increase, individuals and businesses seek additional ways to process and store information. One option available to these users is an information handling system. An information handling system generally processes, compiles, stores, and/or communicates information or data for business, personal, or other purposes thereby allowing users to take advantage of the value of the information. Because technology and information handling needs and requirements vary between different users or applications, information handling systems may vary with respect to the type of information handled; the methods for handling the information; the methods for processing, storing or communicating the information; the amount of information processed, stored, or communicated; and the speed and efficiency with which the information is processed, stored, or communicated. The variations in information handling systems allow for information handling systems to be general or configured for a specific user or specific use such as financial transaction processing, airline reservations, enterprise data storage, or global communications. In addition, information handling systems may include or comprise a variety of hardware and software components that may be configured to process, store, and communicate information and may include one or more computer systems, data storage systems, and networking systems.

An information handling system is typically housed with a rack. A rack is a structure that is able to house multiple information handling systems, with each system occupying one or more slots in the rack. Multiple racks can be housed within a single room or data center. The design of the rack typically allows access to and removal of each system from the rack. The depth of a rack is a measure of the distance of the rack in the direction that is transverse to the face of the rack. If a rack is sufficiently deep, the rack can house computer systems that have a configuration in which the depth of the chassis or housing of the computer system is long as compared length or width of the face of the computer system.

One difficulty of data centers is the heat generated by the multiple computer systems in the data center. Excessive heat leads to high cooling costs for a data center and can result in the degradation in the performance of the computer systems of the rack or data center. In an effort to remove heat from a data center having multiple racks, racks having a sizeable depth have been arranged in a cooling center along parallel lines in a row so that the heat from two adjacent racks is expelled into a common area between the racks, which area is known as the hot aisle. Directly opposite the hot aisle, on the other side of each row of racks is a cool aisle, which is distinguished by the fact that no heated air is expelled from a rack into the cool aisle. Although the arrangement of rows of racks to create alternating and wide hot aisles and cool aisles creates some advantages in the management of heat generated by the computer systems of the data center, this arrangement has a large footprint and consumes a substantial amount of floor space in the data center, thereby reducing the number of computer systems that can be housed within the available space of the data center.

SUMMARY

In accordance with the present disclosure, a rack system is disclosed. The racks and the computer systems included within the racks have a shallow configuration. The racks are placed next to one another in a back-to-back configuration in which the backs of each of the racks are adjacent to one another. All of the user-accessible components of the computers system face toward the front of each rack. The heated air from each of the computer systems is expelled in the space between each of the racks. The space between each of the racks is relatively narrow, as there are no user-accessible components between the racks. The racks are coupled to one another with a bar that may include at least some spring action to accommodate some movement of the racks toward or away from one another without the tipping of either rack.

The rack system described herein is technically advantageous. Because both the computer systems and the racks have a shallow profile, the footprint of the racks in the data center can be reduced, without sacrificing the computing power or capacity of the data center. In addition, the placement of all of the user-accessible controls of each of the computer systems at the front side of each rack permits the back sides of two adjacent racks to be placed immediately adjacent to one another. Because no access is needed for the back of the racks, two racks may be placed immediately next to each other in a back-to-back configuration in which the space between the racks forms a narrow hot aisle. In addition, because two racks are placed immediately adjacent to one another, the racks can be coupled to one another through a tension rod, which restricts the ability of each of the racks to tip toward or away from one another. Other technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 1 is a diagram of the arrangement of rows of racks in a data center.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

Shown in FIG. 1 is a diagram of the arrangement of rows of racks in a data center, which is indicated generally at 10. Rows of racks are shown at 12, and individual racks are indicated at 14. In the data center arrangement of FIG. 1, racks 14 are shown in two depth configurations. Deep racks are indicated at 14 a, and shallow racks are shown at 14 b. Each rack includes a number of computer systems or information handling systems 13, with each rack typically including one computer system in each slot 18 in the rack. Each rack includes a frame and a number of slots 18 formed in frame. In the data center arrangement of FIG. 1, two shallow racks 14 b are placed immediately adjacent to one another so that a narrow aisle 15 is formed between adjacent shallow racks 14 b. The narrow aisle between immediately adjacent shallow racks is known as a hot aisle because heated air is expelled from the computer systems of each of the adjacent shallow racks into the hot aisle 15.

The hot aisle is narrow in width because of the short distance between each of the adjacent shallow racks that form the boundaries of the hot aisle. The shallow racks 14b are placed in a back-to-back configuration so that the front of each of the racks is oriented to face away from each other so that the back of the racks face toward each other. In this configuration, the front side of the racks is characterized as the side of the racks that includes the set of controls of the computer systems that are most often accessed by the user. These controls of the computer system include the user-adjusted controls of the system, such as the input of media drives and the on-off switch. Hot air is not expelled from the computer systems in the direction of the front side of the racks. In one configuration, all of the user-accessible features of the computer systems of the racks are included on the front side of the rack; and none of the user-accessible features of the computer systems are included on the back side of the rack. The back side of the rack is characterized by the side of the rack from which hot air is expelled from the computer systems of the rack. The aisle that runs along the front side of each of the racks is known as the cool aisle 16 and is characterized by the fact that hot air is not expelled by the computer systems of the racks into the cool aisle.

As shown in FIG. 1, the adjacent shallow racks are coupled to one another through a tension bar 18 that is located near the top portion of each of the shallow racks. Tension bar is a semi-rigid bar that prevents each of the two adjacent rows of racks from tilting toward or away from one another. The tension bar may be biased or otherwise include some spring action in both the compressive and extensive directions to compensate for at least some movement in one of the rows of racks without causing a compensating movement in the other coupled rack. Thus, even though a pair of shallow racks does not include a footprint that is as wide as a standard size rack, the coupling of a tension bar between the racks extends the effective footprint of the racks and prevents the racks from tipping toward or away from one another.

Shallow racks 14b may have a depth of about twenty inches, and the computer systems in the rack may themselves have a shallow configuration with a depth of about fifteen inches or less. The width of the hot aisle, which is the distance between the back of each of the immediately adjacent racks may be as short as eight inches or less. The depth of the rack and the computer systems, and the width of the hot aisle may vary, depending on the precise configuration and design constraints of the data center and racks. Tension bar 18 may be sized so that the distance between the racks is fixed at a preferred distance, which may be eight inches, as just one example. Assuming that the cool aisle between pairs of rows of racks will have a width of thirty-six inches, the footprint of a pair of coupled racks (two racks with a narrow hot aisle between the racks) and an adjacent cool aisle of thirty-six inches will be approximately seventy-two inches in width. This footprint is approximately the same size as the footprint of a standard depth rack with an adjacent a cool aisle.

In the configuration of FIG. 1, all of the user-accessible features of the computers systems of the racks, including the on-off switch and all of the cabling of the computer systems, are oriented to face the cool aisle. None of the user-accessible features of the computer system are oriented toward the hot aisle. In this configuration, because there is no need for a user to access the rear of the racks, the racks may be placed close to one another, and the hot aisle may have a very small width, which results in a reduced footprint for the entire rack configuration.

Data center configuration 10 may also include an end cap 26 that is placed at the end of each pair of immediately adjacent rows of racks. The end cap 26 covers the side opening of the racks at the end of each row of racks. The presence of the end cap 26 prevents heated air from escaping through the sides or ends of the immediately adjacent rows of racks. Because the air cannot escape through the end or sides of the racks, heated air can only escape through the top or upper portion of the racks. A set of supplemental chiller units 22 may be placed above the racks. As indicated by the downward-pointing arrows of FIG. 1, the supplemental chiller units may blow cool air into the cool aisles and may exhaust hot air from the hot aisles. If a vacuum is created at the top of the aisles in the vicinity of the hot aisles, a plenum will be formed in which heated air from the hot aisles moves in an upward direction away from the floor 24 of the data center and toward the chiller units 22 of the data center, as indicated by the upward-pointing arrows of FIG. 1.

The configuration for a set of racks provides several advantages. Because both the computer systems and the racks have a shallow profile, the footprint of the racks in the data center can be reduced, without sacrificing the computing power or capacity of the data center. The placement of all of the user-accessible controls of each of the computer systems at the front side of each rack permits the back sides of two adjacent racks to be placed immediately adjacent to one another. Because no access is needed for the back of the racks, two racks may be placed immediately next to each other in a back-to-back configuration in which the space between the racks forms a narrow hot aisle. Because two racks are placed immediately adjacent to one another, the racks can be coupled to one another through a tension rod, which restricts the ability of each of the racks to tip toward or away from one another. Although the present disclosure has been described in detail, it should be understood that various changes, substitutions, and alterations can be made hereto without departing from the spirit and the scope of the invention as defined by the appended claims.

What is claimed is:

1. A rack system housing multiple computer systems, comprising
   a plurality of adjacent rows of racks;
   a first rack in a first portion of a first row of the rows of racks forming multiple slots, wherein each slot is sized to accommodate a computer system;
   a second rack in a second portion of the first row of the rows of racks coupled to the first rack, wherein the first rack and the second rack are coupled by a bar member located at a top portion of each of the first rack and the second rack, wherein the bar member fixes a distance between the first rack and the second rack, wherein the bar member includes spring action in both compressive and extensive directions, and wherein the bar member compensates for a movement of the second rack, by compressing or extending, without causing a corresponding movement in the first rack;
   multiple computer systems, wherein each computer system is housed within a slot of each rack, and wherein each of the user-accessible controls of the computer system is placed on the side of the computer system that is proximate the front of the first rack and the second rack;
   a plurality of end caps placed at an end of each pair of adjacent rows of racks, wherein the end caps cover the side opening of each rack at the end of the rows of racks, wherein the end caps prevent heated air from escaping;
   a hot aisle, wherein the hot aisle is between the first portion and the second portion of the first row by the back-to-back configuration of the first rack and the second rack;
   a third rack in a second row of the rows of racks adjacent to the coupled first rack and second rack, wherein the third rack is sized to house multiple computer systems;
   a cool aisle, wherein the cool aisle separates each of the adjacent rows of racks, and wherein the front side of the first rack and the front side of the third rack faces the cool aisle;
   a chiller unit positioned above the first rack and the second rack, wherein the chiller unit blows cool air into the cool aisle and exhausts the heated air from the hot aisle;
   wherein the first rack and the second rack are coupled to one another in a back-to-back configuration with each back of the first rack and the second rack immediately adjacent to each other so that the hot aisle is formed, and wherein the depth of the third rack is greater than the depth of the back-to-back configuration of the first rack and the second rack; and
   wherein the third rack is independent of the first and second racks.

2. The rack system of claim 1, wherein the distance between the first rack and the second rack is approximately eight inches.

3. The rack system of claim 1, wherein the distance between the first rack and the second rack is approximately less than eight inches.

4. The rack system of claim 1, wherein heated air generated by the computer systems is expelled in the space between the first rack and the second rack.

5. The rack system of claim 1, wherein heated air generated by the computer systems is not expelled toward the front side of the respective racks.

6. The rack system of claim 1, wherein the depth of the first rack is approximately twenty inches.

7. The rack system of claim 1, wherein the depth of the first rack is less than approximately twenty inches.

8. The rack system of claim 1, wherein the bar member includes a compressive force to prevent the rack from tipping towards each other.

9. The rack system of claim 1, wherein the bar member includes some spring action to accommodate at least some movement of the racks toward one another.

10. The rack system of claim 1, wherein the bar member includes some spring action to accommodate at least some movement of the racks away from one another.

11. A method for forming a rack system, comprising:
    forming adjacent rows of racks, wherein each rack comprises a frame;
    placing end caps that cover a side opening of each rack at an end of each pair of adjacent rows of racks, wherein the end caps prevent heated air from escaping;
    placing a first rack in a first portion of a first row of the rows of racks;
    populating one or more slots formed in a first rack of the first rack with one or more computer systems;
    placing a second rack in a second portion of the first row of the rows of racks such that the second rack and the first rack are in a back-to-back configuration;
    populating one or more slots formed in a second rack of the second rack with one or more computer systems;
    coupling the first rack to the second rack using a bar member located at a top portion of each of the first rack and the second rack, wherein the bar member fixes a distance between the first rack and the second rack, wherein the bar member includes spring action in both compressive and extensive directions, and wherein the bar member compensates for a movement of the second rack, by compressing or extending, without causing a corresponding movement in the first rack;
    forming a hot aisle between the first portion and the second portion of the first row by the back-to-back configuration of the first rack and the second rack with each back of the first rack and the second rack immediately adjacent to each other;
    placing a third rack in a second row of the rows of racks adjacent to the coupled first rack and second rack, wherein the depth of the third rack is greater than the back-to-back configuration of the first rack and the second rack, and wherein the third rack is independent of the first and second racks;
    populating one or more slots formed in a third rack of the third rack with one or more computer systems;
    forming a cool aisle which separate each of the adjacent rows of racks; and
    positioning a chiller unit above the first rack and the second rack, wherein the chiller unit blows cool air into the cool aisle and exhausts the heated air from the hot aisle, and wherein the front side of the first rack and the front side of the third rack faces the cool aisle.

12. The method of claim 11, wherein the distance between the first rack and the second rack is approximately eight inches.

13. The method of claim 11, wherein the bar member limits a movement of the first rack and the second rack away from one another.

14. The method of claim 11, wherein the bar member includes a compressive force to prevent the rack from tipping towards each other.

15. The method of claim 11, wherein the bar member limits a movement of the first rack and the second rack toward one another.

16. A rack system for housing multiple computer systems, comprising:
a plurality of adjacent rows of racks, wherein each rack comprises a rack;
a plurality of end caps placed at an end of each pair of adjacent rows of racks, wherein the end caps cover the side opening of each rack at the end of the rows of racks, wherein the end caps prevent heated air from escaping;
a first rack in a first portion of a row of the rows of racks, wherein the first rack comprises a plurality of slots formed in a first rack, each of which is populated with a computer system; and
a second rack in a second portion of a first row of racks coupled to the first rack, wherein the second rack comprises a plurality of slots formed in a second rack, each of which is populated with a computer system;
wherein the first rack is coupled to the second rack by a bar member located at a top portion of each of the first rack and the second rack, wherein the bar member fixes a distance between the first rack and the second rack, wherein the bar member includes spring action in both compressive and extensive directions, and wherein the bar member compensates for a movement of the second rack, by compressing or extending, without causing a corresponding movement in the first rack;
a hot aisle, wherein the hot aisle is between the first portion and the second portion of the first row by the back-to-back configuration of the first rack and the second rack, wherein the first rack and the second rack are in a back-to-back configuration with each back of the first rack and the second rack immediately adjacent to each other so that the hot aisle is formed;
a third rack in a second row of the rows of racks adjacent to the coupled first rack and second rack, wherein the third rack comprises a plurality of slots formed in a third rack sized to house multiple computer systems;
a cool aisle, wherein the cool aisle separates each of the adjacent rows of racks, and wherein the front side of the first rack and the front side of the third rack faces the cool aisle;
a chiller unit positioned above the first rack and the second rack, wherein the chiller unit blows cool air into the cool aisle and exhausts the heated air from the hot aisle;
wherein the depth of the third rack is greater than the back-to-back configuration of the first rack and the second rack; and
wherein the third rack is independent of the first and second racks.

17. The rack system of claim 16, wherein the computer systems of the first rack and the second rack are arranged so that all of the user-accessible components of the computer systems of the first rack and the second rack face toward the front of the first rack and the second rack, respectively.

18. The rack system of claim 16, wherein the distance between the first rack and the second rack is approximately less than eight inches.

19. The rack system of claim 16, wherein the bar member prevents the first rack and the second rack from tipping towards each other.

20. The rack system of claim 16, wherein the bar member includes some spring action to accommodate at least some movement of the racks away from one another.

* * * * *